United States Patent [19]

Taylor

[11] Patent Number: 4,887,271
[45] Date of Patent: Dec. 12, 1989

[54] POWER SUPPLY FOR A LASER DIODE IN A COMMON MODULE

[75] Inventor: Stephen J. Taylor, Oxfordshire, United Kingdom

[73] Assignee: Plessey Overseas Limited, Ilford, England

[21] Appl. No.: 233,758

[22] Filed: Aug. 19, 1988

[30] Foreign Application Priority Data

Aug. 19, 1987 [GB] United Kingdom ............... 8719556

[51] Int. Cl.$^4$ .............................................. H01S 3/10
[52] U.S. Cl. ....................................... 372/29; 372/31; 372/36; 372/38
[58] Field of Search ........................ 372/38, 29, 31, 36

[56] References Cited

U.S. PATENT DOCUMENTS 3,898,583 8/1975 Shuey ..................................... 372/38
4,803,689 2/1989 Shibanuma ............................ 372/36

OTHER PUBLICATIONS

M. A. Karr et al., "Output Power Stability of GaAlAs Laser Transmitters Using an Optical Tap for Feedback Control," *Applied Optics*, vol. 18, No. 8, Apr. 15, 1979, pp. 1262–1265.

"Fibre Optic Datalink P35-8800" Plessey Optoelectronics, 1986.

Primary Examiner—James W. Davie
Attorney, Agent, or Firm—Fleit, Jacobson, Cohn, Price, Holman & Stern

[57] ABSTRACT

A power supply for a laser diode comprising optical detector means coupled for monitoring the intensity of light emitted by the diode, the optical detector means being coupled, via capacitive means, for integrating the signal from the detector means, to the gate of a field effect transistor, the field effect transistor being coupled to the control electrode of a transistor means to control the main current path thereof, the transistor means being arranged to regulate the power supply to the laser diode, whereby the power output of the laser diode is stabilised. The power supply is incorporated with the diode in a module for connection to a printed circuit board for coupling to an optical fibre in a local area network.

4 Claims, 1 Drawing Sheet

POWER SUPPLY FOR A LASER DIODE IN A COMMON MODULE

BACKGROUND OF THE INVENTION

1. Field of the Invention

This invention relates to a power supply for a laser diode, the power supply and laser diode being housed in a common module. The laser diode is intended for use in optical fibre communication.

2. Background Art

One known application for a laser diode is for transmission of digital information at some $10^8$ megabits per second along an optical fibre as part of a local area network. The diode is formed in a metal housing together with an integral photodiode to monitor the laser's rear-facet emission. The housing is positioned at an optical part of a module, which is connected on a printed circuit board which contains electronics for power supply and signal modulation of the laser. To stabilise the power supply to provide a constant mean power output the photodiode is coupled to a circuit comprising a multiplicity of operational amplifiers which regulate the current supply to the laser diode. Alternatively, a semi-custom chip has been employed. However, both circuit types are relatively, expensive and too bulky to include within the module itself.

SUMMARY OF THE INVENTION

It is an object of the invention to provide a simple power supply which may be fabricated using standard discrete components such that the entire control circuit may be efficiently incorporated within the laser module.

The present invention provides a power supply for a laser diode comprising optical detector means coupled for monitoring the intensity of light emitted by the diode, the optical detector means being coupled via capacitive means, for integrating the signal from the detector means, to the gate of a field effect transistor, the field effect transistor being coupled to a control electrode of a transistor means to control the main current path thereof, the transistor means being arranged to regulate the power supply to the laser diode, whereby the power output of the laser diode is stabilised.

Thus the present invention provides a simple and effective circuit for efficiently stabilising the output of the laser diode.

The provision of an FET serves two functions, firstly a high impedance buffer so that the signal from the detector means can be effectively processed, and secondly as a voltage controlled resistor in that the impedance of the source-drain path is proportional to the control signal applied to the FET gate. The voltage at the drain output may be applied directly to the base of the bipolar transistor whose collector-emitter path is connected to provide current to the laser diode.

BRIEF DESCRIPTION OF THE DRAWINGS

A preferred embodiment will now be described with reference to the accompanying drawings, wherein.

DESCRIPTION OF THE PREFERRED EMBODIMENT

Figure 2:
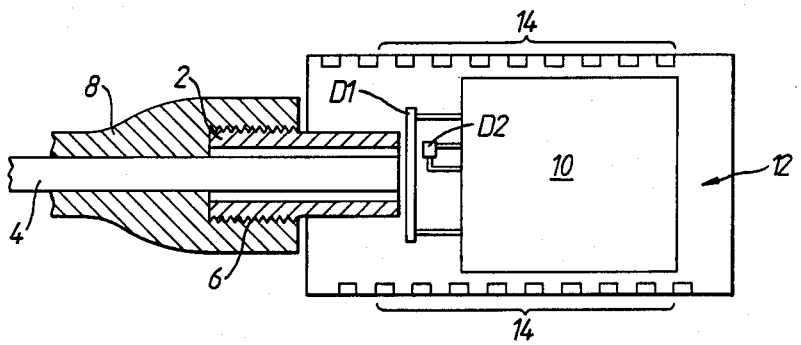
FIG. 2 is a schematic sectional view in elevation of a laser module.

Referring to FIG. 2, there is shown a laser module in section. The module is housed in a fibre resin housing (not shown) and includes a cylindrical brass port 2 for receiving an optical fibre 4 the outer surface of the port having a screw thread 6 for receiving a protective cover 8. A laser D1 is positioned at the end of port 2 and at its rear facet is positioned a photodiode D2. Laser D1, photodiode D2 and other discrete components indicated as at 10 are mounted on a printed circuit board 12 having twenty terminal pins 14 extending therefrom, in order to form a dual-in-line package.

Figure 1:
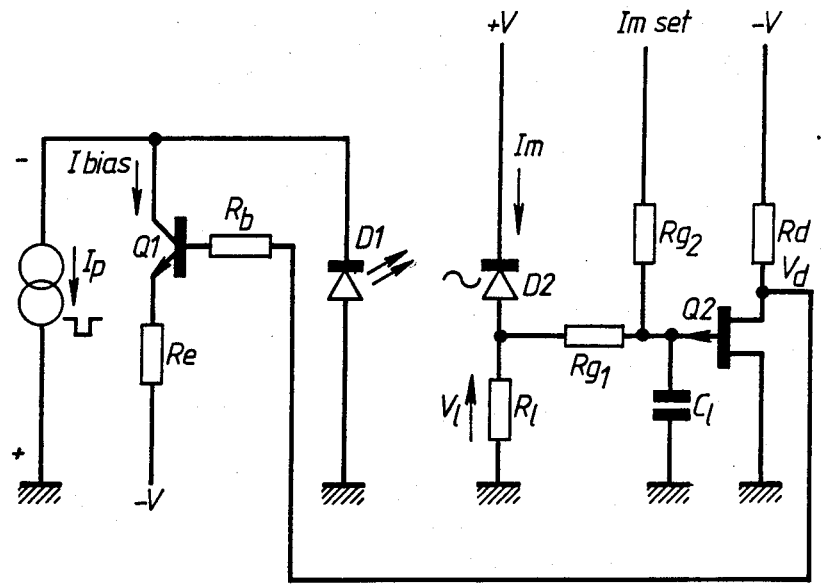
FIG. 1 is a circuit diagram of a power supply for a laser diode.

The circuit D1, D2, 10 is shown as a circuit diagram in FIG. 1.

Referring to FIG. 1, a transistor Q1 connected to a voltage source $-V$ provides a current source (I bias) from its collector-emitter path to bias a laser diode D1 above its threshold and in a linear operating region. A second current source IP provides selective current pulses in order to modulate the light intensity from diode D1. A photodiode D2 monitors the rear-facet emission from diode D1 and provides a variable voltage $V_L$ across resistor R1 which is proportional to the light intensity of the diode.

The voltage $V_L$ is smoothed in an integrating capacitive circuit $Rg_1$, $Rg_2$, $C_L$, which has a long time constant in order that data signal modulations in the diode output can be effectively removed. The capacitive circuit is connected to the gate of an FET transistor Q2, having a very high input impedance, the drain of transistor Q2 being coupled via resistor $R_b$ to control the base of a variable resistance in order to provide a variable control voltage to the base of transistor Q1.

A small voltage is applied to resistor $Rg_2$ in order to set a desired photo-current Im and hence the laser diode power.

It will be understood that although a specific power supply for a laser diode has been disclosed, the invention is limited only by the scope of the following claims.

I claim:

1. A laser module forming a dual-in-line package comprising a printed circuit board having a multiplicity of terminals depending therefrom, a port for receiving the end of an optical fibre, a laser diode positioned at an inner end of the port on the printed circuit board, a photodetector positioned on the printed circuit board to receive light from the rear facet of the photodetector, and a power supply for the laser diode comprising an array of components mounted on the printed circuit board, the power supply including:
   capacitive means coupled to said photodetector for integrating the signal from the photodetector, a field effect transistor having a gate, said capacitive means being coupled to said gate, a transistor means having a control electrode for the control of the main current path thereof, the main current path of said transistor means being coupled to the laser diode to control current flow thereto, and said field effect transistor being connected to said control electrode of the transistor means, whereby the power output of the laser diode is stabilised in operation.

2. A power supply as claimed in claim 1 wherein said transistor means comprises a bipolar transistor.

3. A power supply as claimed in claim 1 including a digital data current pulse source coupled to the laser diode in parallel with said transistor means.

4. A power supply as claimed in claim 1 including preset voltage means coupled to said capacitive means, to set operation of said laser diode above its threshold, said preset voltage means comprising a voltage source and a resistive dividing chain coupled to the voltage source for dividing the voltage thereof.

* * * * *